(12) United States Patent
Wen

(10) Patent No.: US 6,472,238 B1
(45) Date of Patent: Oct. 29, 2002

(54) EVALUATION OF ETCHING PROCESSES IN SEMICONDUCTORS

(75) Inventor: Youxian Wen, Livermore, CA (US)

(73) Assignee: Therma-Wave, Inc., Fremont, CA (US)

( * ) Notice: Subject to any disclaimer, the term of this patent is extended or adjusted under 35 U.S.C. 154(b) by 0 days.

(21) Appl. No.: 09/500,744

(22) Filed: Feb. 9, 2000

(51) Int. Cl.$^7$ .............................................. G01R 31/26
(52) U.S. Cl. ........................ 438/16; 438/17; 324/158.1
(58) Field of Search ............................ 324/765, 158.1; 356/446; 438/16, 17

(56) References Cited

U.S. PATENT DOCUMENTS

| | | | |
|---|---|---|---|
| 5,396,080 A | * 3/1995 | Hannotiau et al. | 250/560 |
| 5,450,205 A | * 9/1995 | Sawin et al. | 356/382 |
| 5,486,701 A | 1/1996 | Norton et al. | 250/372 |
| 5,607,800 A | * 3/1997 | Ziger | 430/8 |
| 5,608,526 A | * 3/1997 | Piwonka-Corle et al. | 356/369 |
| 5,748,296 A | 5/1998 | Canteloup | 356/72 |
| 6,020,968 A | 2/2000 | Horie | 356/382 |
| 6,057,171 A | * 5/2000 | Chou et al. | 438/15 |
| 6,290,130 B1 | * 11/2001 | Drexler | 235/454 |

FOREIGN PATENT DOCUMENTS

| | | | |
|---|---|---|---|
| DE | 40 16 211 A1 | 11/1991 | H01L/21/306 |
| WO | WO 99/02970 | 1/1999 | G01N/21/21 |

OTHER PUBLICATIONS

J.M. Leng, et al., "Simultaneous Measurement Of Six Layers In A Silicon On Insulator Film Stack Using Spectrophotometry And Beam Profile Reflectometry", *American Institute of Physics* J. Appl. Phys., vol. 81, No. 8, Apr. 15, 1997, pp. 3570–3578.

Mark Land, et al., Using Genetic Algorithms With Local Search For Thin Film Metrology "No available date".

J.M. Leng et al., "Combined beam profile reflectometry, beam profile ellipsometry and ultraviolet–visible spectrophotometry for the characterization of ultrathin oxide–nitride–oxide films on silicon," *J. Vac. Sci. Technol. A*, vol. 17, No. 2, Mar./Apr. 1999, pp. 380–384.

W.A. McGahan et al., "Combined Spectroscopic Ellipsometry and Reflectometry for Advanced Semiconductor Fabrication Metrology," *Proceedings of the SPIE*, vol. 2877, Oct. 1996, pp. 132–141.

"Notification of Transmittal of the International Search Report or the Declaration," in PCT/US01/00804, mailed Nov. 19, 2001, 7 pages in length.

\* cited by examiner

*Primary Examiner*—Michael Sherry
*Assistant Examiner*—Paresh Patel
(74) *Attorney, Agent, or Firm*—Stallman & Pollock LLP

(57) ABSTRACT

The subject invention relates to an approach for analyzing etched semiconductor samples using optical measurements. In use, one or more optical measurements are taken on an etched semiconductor wafer. At least one of the measurements includes a range of reflectivity measurements in the visible light region. The average reflectivities in the blue and red visible regions are compared to provide information as to whether the sample has been over or under etched. Once this determination is made, a more accurate analysis can be made of the exact structure of the sample. This approach overcomes the difficulties associated with attempting to analyze a sample where the data must be analyzed without knowledge of whether the sample has been over or under etched. The subject approach can also be utilized in other situations which require the treatment of an upper layer of a sample.

18 Claims, 3 Drawing Sheets

EVALUATION OF ETCHING PROCESSES IN SEMICONDUCTORS

TECHNICAL FIELD

The subject invention relates to the analysis of optical metrology data obtained from measurements on semiconductors. The invention is particularly related to analyzing data obtained from a sample subjected to etching processes.

BACKGROUND OF THE INVENTION

A number of optical metrology tools have been developed to monitor various processes used during the fabrication of semiconductor wafers. One such tool is marketed by the assignee herein under the name Opti-Probe. This tool includes a number of measurement technologies integrated into one device. These measurement technologies include Beam Profile Reflectometry, Beam Profile Ellipsometry, Broad Band Spectrometry, Spectroscopic Ellipsometry and Absolute Ellipsometry. More details about this tool can be found in PCT WO 99/02970 published Jan. 21, 1999.

In a semiconductor fabrication facility, a tool like the Opti-Probe might be used to evaluate a variety of types of semiconductor samples. The samples have a wide range of characteristics including the number and types of layers. For any particular sample, one or more measurement technologies found in the Opti-Probe will be best suited to provide the needed analysis. For a new type of sample, applications engineers will develop a "recipe" for using the Opti-Probe that achieves the most accurate evaluation of the samples in the least amount of time. For example, a certain sample might best be analyzed with a combination of measurements from the Beam Profile Reflectometry module and the Spectroscopic Ellipsometer module.

In addition to selecting the best measurement technologies, a mathematical model must be designed to permit accurate mapping of the data. The mathematical model will have a layered structure corresponding to the expected layer structure on the sample. Such an expected layer structure might include a top metal layer and a bottom layer of silicon dioxide, both formed on a silicon substrate. The processor will be seeded with information about the expected parameters of each layer of the sample. Examples of these parameters include thickness, index of refraction and extinction coefficient of the layer. Using Fresnel equations, the processor will calculate theoretical measurements results for each of the measurement technologies which were used. These theoretical results are compared with the actual measured data. If the calculated theoretical data does not match the actual measured data, the starting parameters will be modified and theoretical measurement results will be calculated again and compared to the measured data. These steps are repeated in an iterative process until the calculated data closely matches the actual measured data. At this point, the theoretical parameters are considered to represent the parameters of the actual sample.

Various algorithms such as least squares fitting algorithms can be used to derive the solution through an iterative process. Additional details relating to the development of a recipe and how it would be used to evaluate a sample can be found in "Simultaneous Measurement of Six Layers in a Silicon on Insulator Film Stack Using Spectrophotometry and Beam Profile Reflectometry," Leng, et. al., *Journal of Applied Physics*, Vol .81, No. 8, Apr. 15, 1997. See also "Using Genetic Algorithms with Local Search for Thin Film Metrology," Land et. al., *Proceedings of the Seventh International Conference on Genetic Algorithms*, Michigan State University, Jul. 19–23, 1997.

With the advent of sub-micron feature sizes, dry (plasma) etching has become one of the most important processes in semiconductor manufacturing. Fluorocarbon gases are often used as the primary media for removing silicon dioxide from silicon or a polycrystalline silicon surface. The plasma affects the etching process both physically and chemically. At the end of the process, the wafer will often have a thin top film layer of a polymer or amorphous fluorosilicon. If the etching process was not fully complete, there will also be a thin layer of silicon dioxide remaining on the wafer. In this case, the wafer is considered "under etched." If the etching process removes all of the silicon dioxide, the wafer is considered "over etched." In the latter case, the process will often create a damaged silicon or polycrystalline layer. In order to successfully control the etch process, the metrology tool needs to be able to measure the fluorosilicon layer, any silicon dioxide layer remaining and the thickness of any damage layer caused by the process.

One problem with obtaining good measurement results when analyzing etched structures as described above is that it is difficult to develop one mathematical model or recipe which adequately defines both the over etched and under etched situation. The subject invention is intended to address this problem.

SUMMARY OF THE INVENTION

In accordance with the subject invention, a new approach has been developed to improve the accuracy of the analysis of data associated with etch procedures. In this approach, separate recipes are developed for both the over etched and under etched conditions. In a preliminary stage, the processor makes a relatively simple analysis of selected reflectivity data to determine whether the sample is over or under etched. Once this initial determination is made, the processor will apply the appropriate recipe (either over or under etched) to complete the analysis of the data. The initial analysis can also be used to determine which measurement technologies are best suited to complete the evaluation of the sample. This two step process provides for a more accurate analysis of the data.

The subject approach would have utility for the evaluation of samples subjected to other forms of layer treatment processes. For example, another well known layer treatment process is CMP (chemical mechanical polishing or planarization). In this process, irregularities on the surface of a dielectric film are reduced by polishing the surface with a chemical slurry. The subject system could be used to initially determine the extent to which the layer had been removed and then, based on that information, apply the appropriate analytical recipe to analyze the sample.

DETAILED DESCRIPTION OF THE PREFERRED EMBODIMENT

Figure 1:
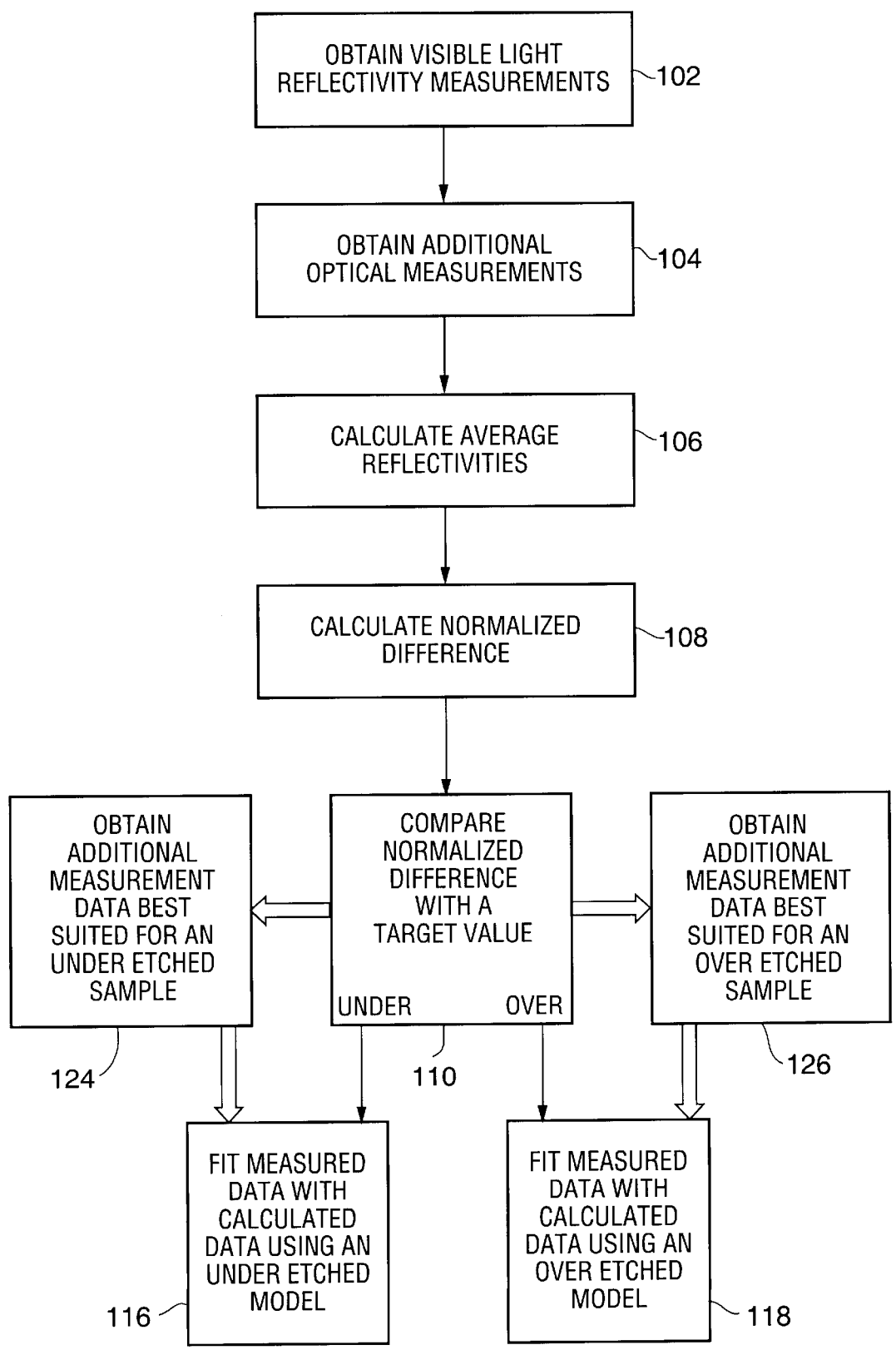
FIG. 1 is a flow chart of the steps taken by a processor to carry the analysis of the subject invention.

As noted above, various optical metrology devices exist which can be used to monitor semiconductor fabrication processes. One such device, marketed by the assignee herein under the mark Opti-Probe, includes multiple measurement technologies. All of these technologies are non-contact techniques wherein a probe beam is directed to interact with the sample. Changes in the probe after it has interacted with the sample are monitored. The techniques include in the Opti-Probe measurements of the reflectance of the sample using both laser based and polychromatic light sources for generating test beams. The Opti-Probe is also capable of obtaining ellipsometric measurements, again using both laser based and polychromatic light sources for generating test beams.

Other manufactures offer metrology tools with multiple measurement technologies. For example, KLA-Tencor currently offers an ASET-F5 product which includes both broadband spectroscopy and spectroscopic ellipsometry measurement modules. Information about this type of device can be found in U.S. Pat. No. 5.608.526, issued Mar. 4, 1997. The subject invention can be used with either of these devices or others which are used to monitor etch control of semiconductor wafers.

As noted above, one important semiconductor fabrication procedure includes the removal of portions of a silicon dioxide layer using a plasma etching procedure. During the etch procedure, a number of wafers are positioned in a chamber and subjected to fluorocarbon gas. The gas reacts with the silicon dioxide to etch the oxide layer. After the etching step is completed, one or more of these wafers will be transported to a metrology tool to evaluate the condition of the wafer. At the beginning of a run or when the etching equipment has been taken off-line for repairs, relatively detailed testing may be required. Where the etching station has been up and running successfully, spot checks of the wafers might be sufficient.

In any case, the metrology tool will take a series of measurement on the wafer, the measurements being selected to best analyze the expected material layers. For example, the particular combination of layers might best be measured with a basic broad band scan of reflectivity, i.e. measuring the reflectance of the sample over a broad range of wavelengths, from the UV at 200 nm to the upper end of the visible spectrum at 800 nm. If this measurement alone is not sufficient, the Opti-Probe tool might also be programmed to take measurements using the Beam Profile Reflectometry or Beam Profile Ellipsometry modules. Alternatively, a broad band spectroscopic ellipsometry measurement might be suitable, either alone or in combination with other technologies. Generally speaking, the more technologies that are used to measure a sample, the more accurate the analysis will be. However, the more measurement technologies that are used, the slower the overall evaluation will be. Not only will the data acquisition be slower, but also the analysis of larger quantities of data will also slow the system. Thus, it is the job of the applications engineer to identify the measurement techniques with the most information content to permit both accurate and fast analysis.

Another job of the application engineer is to design a theoretical model which closely matches the actual sample. In this way, the measured data can be more easily fit to the theoretical data generated using the model.

In the past, it has been very difficult to construct a suitable model for analyzing samples which have been etched. This difficulty arises because the physical structure of the over etched sample is so different from the physical structure of the under etched sample. As noted above, if the sample is under etched, it will include a top polymer layer, a silicon dioxide layer and an undamaged silicon substrate. If the sample is over etched, it will consist of a top polymer layer, no silicon dioxide layer and a damaged layer of silicon. This wide variation in structure has made it very difficult to analyze etched samples.

This problem is remedied herein by including an initial and relatively simple analysis of the reflectivity data to determine in advance whether the sample has been over etched or under etched. It has been found by the inventor herein that the average reflectance of a sample tends to decrease from the blue region of visible light to the red region of visible light for the over etched condition. In contrast, it has been determined that for the under etched condition, the average reflectance over this range is relatively constant or increasing. This discovery permits the processor to initially identify the under or over etched condition. At this point, the data can be fit to a specific model appropriate to either the under or over etched condition.

FIG. 1 is an illustration of the steps to be taken in accordance with the subject invention. In step 102, the metrology device takes reflectivity measurements over a relatively broad band of visible light wavelengths. In the Opti-Probe device, this can include relatively conventional spectroscopic measurements. More specifically, in the Opti-Probe 5000, light from a white light source is focused and directed to the sample. The reflected light is dispersed by a grating onto a photodiode array. Each detector element in the array corresponds to a narrow wavelength region of light. The voltage output from the array is normalized and the result corresponds to the reflectivity of the sample. Alternatively, the Opti-Probe is also capable of deriving broad band reflectance measurements from the DC signal generated by the rotating compensator spectroscopic ellipsometer. Such a DC reflectance signal can also be obtained from various other conventional broadband spectroscopic ellipsometers.

At the same time the wafer is in the tool, additional measurements, which will be required to fully analyze the sample, are typically made. This is shown in step 104 and for the Opti-Probe would include, for example, BPR and BPE measurements.

Once all the data has been acquired, a processor can be used to determine whether the wafer has been over or under etched. This processing can be performed with an on-board computer or in a separate module. In the preferred embodiment, the processor will determine an average reflectivity in both the blue and red ranges of the visible spectrum. In a device such as the Opti-Probe 5000, were each element in the array corresponds to a certain wavelength region of light, the average reflectivity for a laser range can be determined by averaging the voltage generated by a group of pixels associated with the wavelength region of interest.

To give a specific example, the wavelength range of interest in the blue region for the broad band spectrometer of the Opti-Probe 5000 is 410 to 445 nm. The wavelength range of interest in the red region is 740 to 780 nm. The processor will compute the average reflectivity for these two ranges in step 106 by taking an average voltage level generated by the pixels in these two ranges.

In step 108, the processor will calculate the normalized difference between the average reflectivities in accordance with the following formula:

$$\text{Normalized Difference} = \frac{\text{Average Blue Reflectivity} - \text{Average Red Reflectivity}}{\text{Average Red Reflectivity}} \quad (1)$$

The result of this computation (normalized difference) is then compared to a target value in step 110. The target value is obtained from empirical testing. In practice, it has been found that the target value for the broad band spectrometer of the Opti-Probe 5000 can be set at −0.01. If the calculated normalized difference is less than the target value, the sample is considered under etched. If the normalized difference is more than the target value, the sample is considered over etched.

Based on this initial determination, the processor can determine the appropriate model for analyzing the totality of the acquired data. In either case, a multilayer model is used which includes an upper layer of polymer, a lower layer of silicon dioxide and a damaged layer (similar to amorphous silicon). Also in both cases, the starting parameters for the thickness of each layer is set to zero. If it has been determined that the sample is under etched, it is unlikely that there is a damaged layer. Thus, in this case, during the data fitting step 116, the damage layer thickness will be forced to remain at zero thickness while the polymer and silicon dioxide layer thicknesses are allowed to float until a proper solution is reached. If it has been determined that the sample has been over etched, then there will be no layer of silicon dioxide. In this case, during the fitting step 118, the polymer and damage layer thicknesses are allowed to float while the silicon dioxide layer is forced to remain at zero. In the recipe, critical point dispersion models are applied for both polymer and damage layers and a lookup table of silicon oxide is used for the silicon oxide layer. Using the appropriate model parameters, a best fit solution can be determined using least squares fitting or other approaches such as genetic algorithms as discussed above.

As can be appreciated, in the approach described above, the initial determination of whether the sample has been over or under etched allows the number of variables to be reduced during the analysis of the data. This approach reduces the amount of measurements which need to be taken and increases speed and accuracy.

In the steps described above, all of the desired data was taken prior to any mathematical analysis by the processor. In certain measurement situations, it may be that the initial determination of the etch condition could be used to control which additional measurement techniques are best for the particular sample. In this case, step 104 would not be performed after step 102. Rather, after a basic reflectivity measurement (step 102), the processor would evaluate the sample in steps 106, 108 and 110 to determine if the sample is over or under etched. Once this determination is made, the processor can instruct the metrology tool to take the measurements most appropriate to the condition. For example, the tool can take one set of measurements for the under etch situation (step 124) and a different set of measurements for the over etch situation (step 126). Once these measurements are taken, the analysis of the data can proceed in accordance with steps 116 and 118.

Figure 2A:
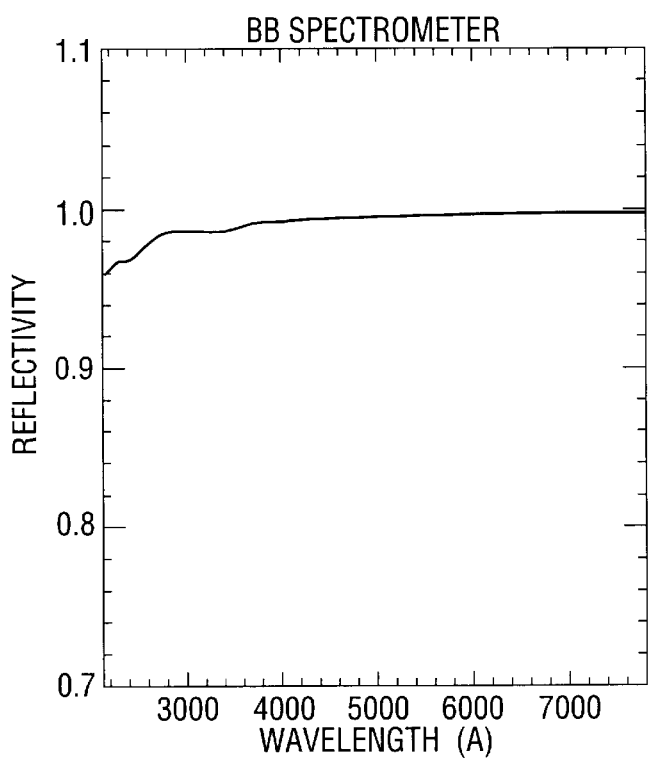
FIG. 2A is a plot of reflectivity verses wavelength using a broad band light source to measure an under etched sample.
Figure 2B:
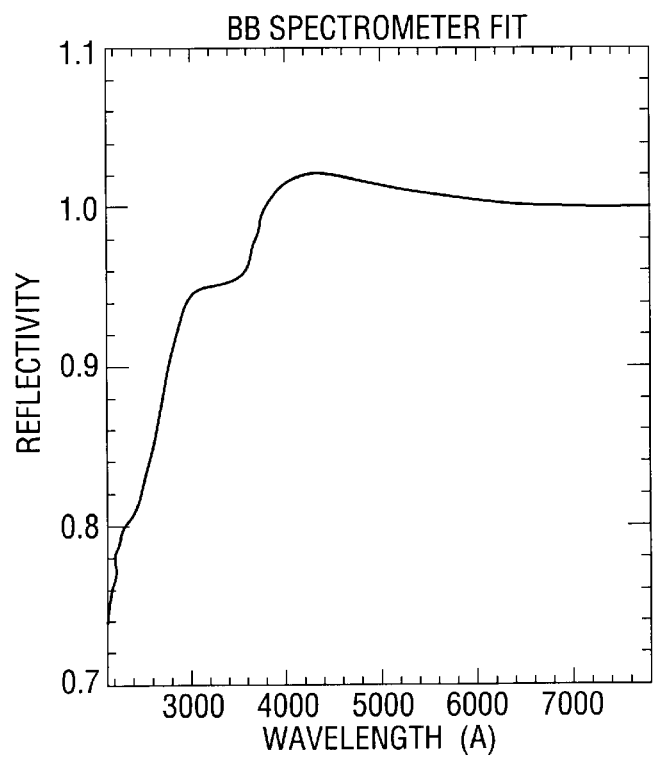
FIG. 2B is a plot of reflectivity verses wavelength using a broad band light source to measure an over etched sample.
Figure 3A:
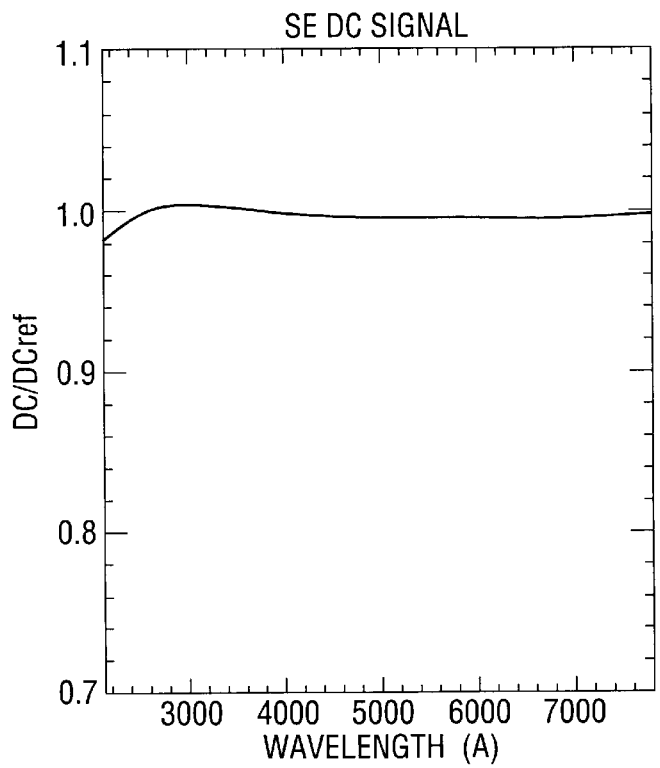
FIG. 3A is a plot of reflectivity verses wavelength using the DC signal from a spectroscopic ellipsometer to measure an under etched sample.
Figure 3B:
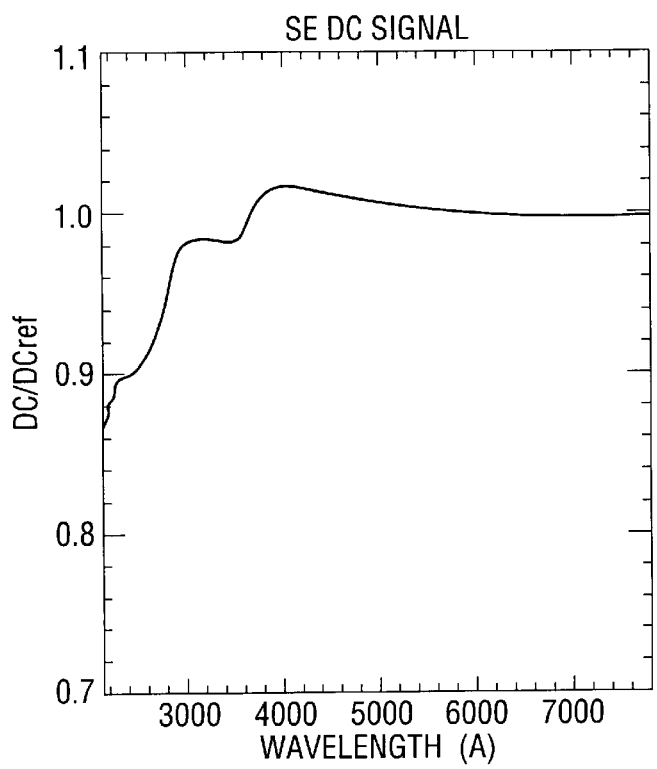
FIG. 3B is a plot of reflectivity verses wavelength using the DC signal from a spectroscopic ellipsometer to measure an over etched sample.

FIGS. 2 and 3 are examples of simulated reflectivity spectra for different technologies associated with the under and over etched conditions. The under etched condition is defined as having a silicon dioxide thickness of 50 angstroms (FIGS. 2A and 3A). The over etched condition has no silicon dioxide layer, a 50 angstrom top polymer layer and a 10 angstrom damage layer in the silicon (FIGS. 2B and 3B). FIGS. 2A and 2B are spectra which could be obtained using the broad band spectrometer in the Opti-Probe 5000. FIGS. 3A and 3B are spectra which might be obtained from the DC signal generated by the spectroscopic ellipsometer of the Opti-Probe 5000.

While the subject invention has been described with reference to a preferred embodiment, various changes and modifications could be made therein, by one skilled in the art, without varying from the scope and spirit of the subject invention as defined by the appended claims. For example, the specific wavelength ranges selected for the comparison can be adjusted based on the samples and the tool. In particular, some tools such as the assignee's Optiprobe model 3260 have a smaller wavelength scan range in the visible. In this case, the blue range of wavelengths selected for the analysis might be 475–510 nm.

In addition, the approach can be applied to other processes where a top layer of a sample is subjected to a treatment step. As noted above, one such treatment procedure is CMP. The subject approach could permit a relatively simple determination of whether the entire layer of interest was removed from the substrate. Once this information has been extracted, the appropriate recipe can be selected to allow a more accurate determination of the characteristics of the sample.

I claim:

1. A method of evaluating a semiconductor wafer including a substrate and at least one layer formed there, said wafer having been subjected to an etching process, said method comprising the steps of:

measuring the wafer by obtaining optical measurements at a plurality of wavelengths, said measurements including reflectivity measurements;

comparing the average reflectivity across one wavelength range with the average reflectivity across another wavelength range to determine if the wafer has been over or under etched; and evaluating the characteristics of wafer based on the measurements, said characteristics including at least one of layer thickness, index of refraction and extinction coefficient, with the evaluation being premised upon the determination of whether the wafer has been over or under etched.

2. A method as recited in claim 1 wherein said one wavelength range is in the blue region of visible light and said another wavelength range is in the red region of visible light.

3. A method as recited in claim 1 wherein the average reflectivity in said one range is subtracted from the average reflectivity in said another range to define a difference value which is compared to a target value.

4. A method as recited in claim 3 wherein said difference value is normalized by dividing said difference value by the average reflectivity of said another range.

5. A method as recited in claim 1 wherein the step of evaluating the wafer includes using a fitting algorithm and a model selected based on whether the wafer is over or under etched.

6. A method as recited in claim 1 wherein said measuring step includes obtaining spectroscopic ellipsometric data.

7. A method as recited in claim 1 further including obtaining additional measurements of the wafer, said additional measurements being selected based on the determination as to whether the wafer is over etched or under etched and using those measurements to evaluate the wafer.

8. A method of evaluating a semiconductor wafer including a substrate and at least one layer formed there, said wafer having been subjected to an etching process, said method comprising the steps of:

measuring the wafer by obtaining optical measurements at a plurality of wavelengths, said measurements including reflectivity measurements;

comparing the average reflectivity across one wavelength range with the average reflectivity across another wavelength range to determine if the wafer has been over or under etched;

selecting an analytical model for evaluating the wafer based on whether the wafer has been over or under etched; and evaluating the characteristics of the wafer based on the measurements using a fitting algorithm applied to the selected analytical model.

9. A method as recited in claim 8 wherein said one wavelength range is in the blue region of visible light and said another wavelength range is in the red region of visible light.

10. A method as recited in claim 8 wherein the average reflectivity in said one range is subtracted from the average reflectivity in said another range to define a difference value which is compared to a target value.

11. A method as recited in claim 10 wherein said difference value is normalized by dividing said difference value by the average reflectivity of said another range.

12. A method as recited in claim 8 wherein said measuring step includes obtaining spectroscopic ellipsometric data.

13. A method as recited in claim 8 further including obtaining additional measurements of the wafer, said additional measurements being selected based on the determination as to whether the wafer is over etched or under etched and using those measurements to evaluate the wafer.

14. A method of evaluating a sample including a substrate and at least one layer formed thereon, said sample having been subjected to a treatment process intended to modify the upper layer, said method comprising the steps of:

measuring the sample by obtaining optical measurements at a plurality of wavelengths, said measurements including reflectivity measurements;

comparing the average reflectivity across one wavelength range with the average reflectivity across another wavelength range to determine the extent to which the upper layer has been modified;

selecting an analytical model for evaluating the wafer based on the extent to which the upper layer has been modified; and evaluating the sample based on the measurements using a fitting algorithm applied to the selected analytical model.

15. A method as recited in claim 14 wherein said one wavelength range is in the blue region of visible light and said another wavelength range is in the red region of visible light.

16. A method as recited in claim 14 wherein the average reflectivity in said one range is subtracted from the average reflectivity in said another range to define a difference value which is compared to a target value.

17. A method as recited in claim 16 wherein said difference value is normalized by dividing said difference value by the average reflectivity of said another range.

18. A method as recited in claim 14 wherein said measuring step includes obtaining spectroscopic ellipsometry measurements.

* * * * *